Figure 1:
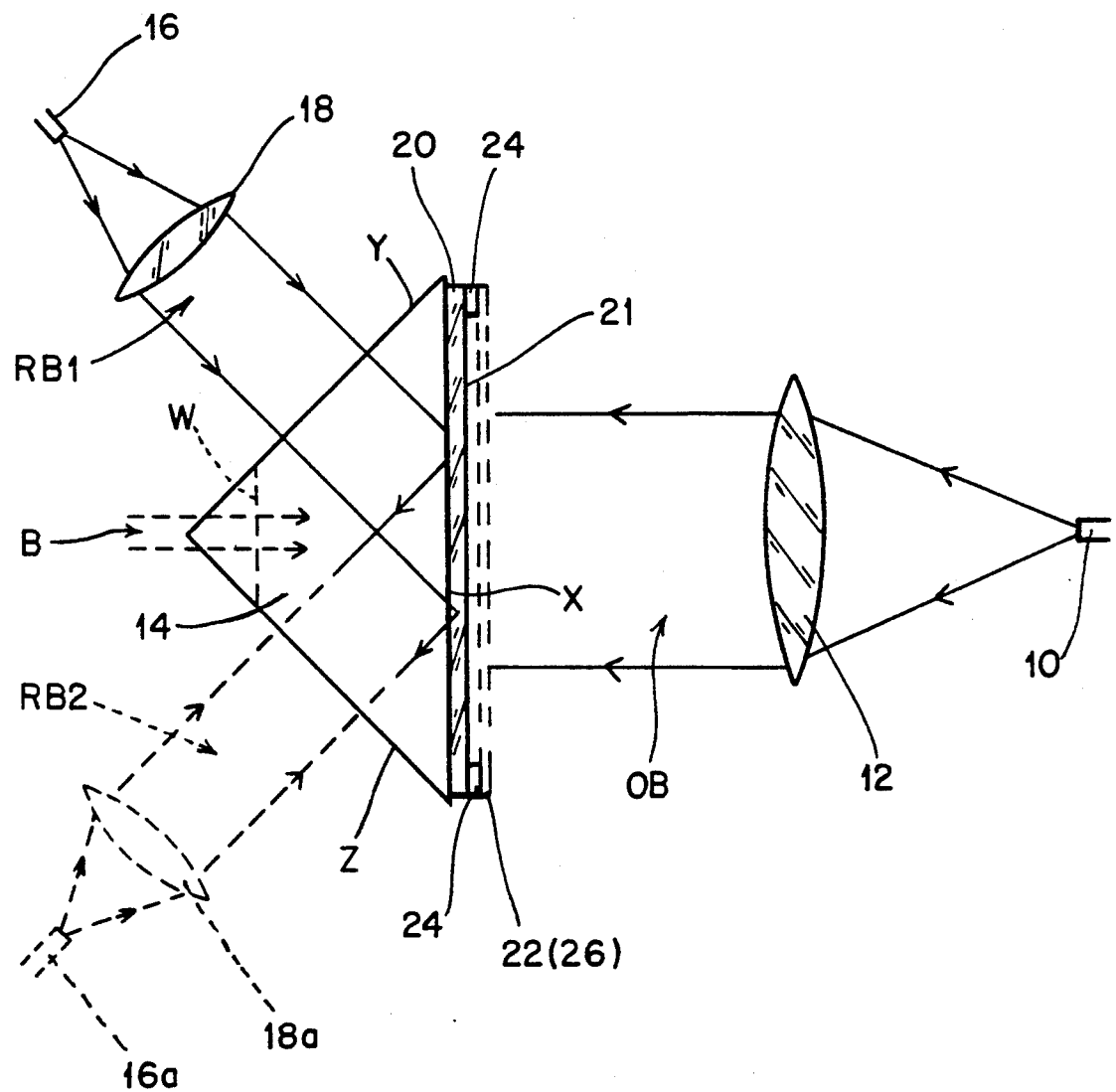

United States Patent [19]

Hugle

[11] Patent Number: 5,322,747
[45] Date of Patent: Jun. 21, 1994

[54] METHOD OF MANUFACTURING AN OPTICAL DISC

[76] Inventor: William B. Hugle, 2 Avenue de la Gare, Neuchatel, Switzerland

[21] Appl. No.: 117,481

[22] Filed: Sep. 7, 1993

Related U.S. Application Data

[63] Continuation of Ser. No. 773,970, filed as PCT/GB90/00438, Mar. 22, 1990, abandoned.

[30] Foreign Application Priority Data

Mar. 22, 1989 [GB] United Kingdom ............... 8906676
Mar. 28, 1989 [GB] United Kingdom ............... 8907010

[51] Int. Cl.$^5$ ........................... G11B 7/28; G11B 7/26
[52] U.S. Cl. .......................................... 430/1; 430/2; 430/320; 359/12; 369/275.4
[58] Field of Search ............. 430/1, 2, 320, 495; 369/275.4, 288; 359/1, 3, 12; 428/694 ML

[56] References Cited

U.S. PATENT DOCUMENTS

| | | | |
|---|---|---|---|
| 3,647,289 | 3/1972 | Weber | 359/1 |
| 3,909,111 | 9/1975 | Meyerhofer | 359/3 |
| 4,200,395 | 4/1980 | Smith et al. | 356/363 |
| 4,332,473 | 6/1982 | Ono | 356/363 |
| 4,715,670 | 12/1987 | Turukhano | 359/12 |
| 4,801,499 | 1/1989 | Aoyama et al. | 428/694 ML |
| 4,857,425 | 8/1989 | Phillips | 430/2 |
| 4,943,126 | 7/1990 | Lang et al. | 359/12 |
| 4,966,428 | 10/1990 | Phillips | 359/12 |
| 5,100,741 | 3/1992 | Shimodo et al. | 369/288 |

FOREIGN PATENT DOCUMENTS 0271300 6/1988 European Pat. Off. .
61-26042 2/1986 Japan ........................... 430/1

OTHER PUBLICATIONS

Tsunoda et al., "Holographic Video disk: an alternate approach to Optical Video disks", Appl. Opt. 15 1398–1403 (Jun. 1976).

*Primary Examiner*—Charles L. Bowers, Jr.
*Assistant Examiner*—Martin J. Angebranndt
*Attorney, Agent, or Firm*—Edwin D. Schindler

[57] ABSTRACT

A method of manufacturing an optical memory disc, which includes the steps of forming a volume holographic image on a recording medium by interference between an object beam (OB) of coherent light after passage through a mask and a reference beam (RB1) of coherent light, which is totally internally reflected at a surface on which the recording medium is disposed. Thereafter, the mask is replaced by the optical memory disc and formed on a photoresist or other photo-sensitive coating thereof is an image of the holographic recording using a second reference beam (RB2) replayed in the opposite direction from the first reference beam (RB1).

9 Claims, 2 Drawing Sheets

METHOD OF MANUFACTURING AN OPTICAL DISC

This application is a continuation of application Ser. No. 07/773,970, filed as PCT/GB90/00438, Mar. 22, 1990, now abandoned.

This invention relates to a method of manufacturing an optical memory disc and more particularly to a method of manufacturing an erasable memory disc.

Non-erasable optical memory discs may be manufactured by a contact printing method or by a method which includes forming a master using a laser and then impressing reproductions from the embossed master. Although the production of the master requires considerable care and is expensive, the reproduction process is straightforward and relatively inexpensive so that the non-erasable end products are economic.

The manufacture hitherto of erasable optical memory discs on the other hand is considerably more expensive. The discs must comprise a substrate of glass or quartz in order to provide a high degree of flatness. Known optical processes for recording the required patterns onto erasable discs during their manufacture are complex and time consuming and therefore render the production of erasable discs relatively expensive.

In accordance with this invention, there is provided a method of manufacturing an optical memory disc, comprising forming a volume holographic image on a recording medium by interference between an object beam of coherent light after passage through a mask and a reference beam of coherent light which is totally internally reflected at a surface on which the recording medium is disposed, then replacing the mask by an optical memory disc which has a coating of a photosensitive substance and forming an image of the holographic recording on the photosensitive coating using a second reference beam replayed in the opposite direction from the first reference beam.

Preferably the holographic image is recorded on the recording medium in one apparatus and the holographic recording is replayed onto the optical memory disc in a separate, corresponding apparatus.

The method serves for forming the pattern of sites on the disc which are to comprise magneto-optic material, which sites are normally arranged on a spiral path. The method may also serve for forming a spiral track on which these sites are located. The pattern for the track and the pattern for these sites may be formed in successive operations.

The first reference beam may be provided by a laser, but the second or conjugate reference beam may be provided either by a laser or by a light source having a distinct spectral line, close to the wavelength of the first reference beam, in which case filters are used to filter out light of other wavelengths emitted by the light source.

It is necessary for the recording medium to be a photo-sensitive, variable refractive index material which exhibits negligible light scatter during the course of recording the holographic image. Suitable recording media are photopolymeric materials and dichromated gelatin, which exhibit negligible scatter and light absorption and do not shrink or distort during exposure and provide for a high resolution recorded image.

Figure 2:
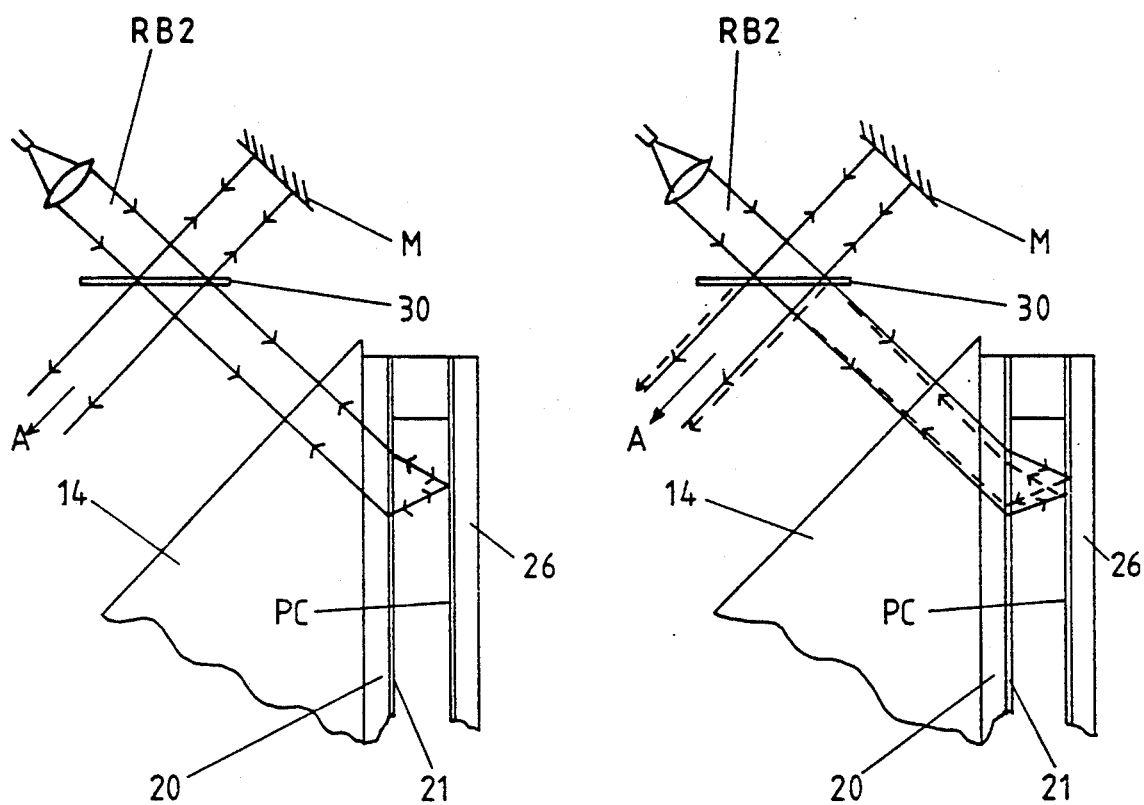

An embodiment of this invention will now be described by way of example only and with reference to the accompanying drawings, in which:

FIG. 1 is a schematic diagram of an apparatus used for recording a holographic image onto a recording medium and then for replaying the holographic recording onto a memory disc; and FIG. 2 shows arrangements for automatically focussing the replayed image onto the memory disc.

Referring to FIG. 1 of the drawings, the apparatus includes a source of coherent light 10 from which an object beam OB is derived by a collimating lens 12. This beam OB is directed perpendicularly towards a surface X of a prism 14. The apparatus further comprises a second source of coherent light 16 from which a reference beam RB1 is derived by a collimating lens 18. This beam RB1 is directed perpendicular to one of the inclined faces Y of the prism. Preferably the light sources 10 and 16 are derived from a single laser using a beam splitter or other arrangement.

In use of the apparatus for recording a holographic image on a recording medium, a glass plate 20 is laid on the surface X of the prism 14 with oil or other index-matching substance first deposited on this surface of the prism, the glass plate 20 and prism 14 having the same refractive index as each other. The reference beam RB1 from laser 16 will pass through the surface of the prism 14 into the plate 20 and will be totally internally reflected at the outer surface of the plate 20, the reflected beam then passing out of the prism perpendicular to its other inclined face Z. The outer surface of the glass plate 20 is provided with a coating 21 of a recording medium, for example either a photopolymeric material or dichromated gelatin as described above. A mask 22, formed with a pattern to be recorded, is disposed close to the glass plate 20 and is spaced therefrom by spacers 24.

The object beam OB passes through the mask and onto the recording medium 21 carried on the outer surface of glass plate 20. Interference occurs between this object beam OB and the reference beam RB1 and the reflected beam, to produce a volume holographic image in the recording medium 21. If the recording medium 21 is a photopolymeric material as described above, the image is then developed in the recording medium 21 by exposing to ultraviolet light.

In order to record onto a memory disc 26, the mask 22 is removed and replaced by an e.g. glass memory disc. Further, the reference beam RB1 is replaced by a reference beam RB2 of opposite direction, i.e. the conjugate reference beam to RB1. This may be achieved by positioning the laser 16 and collimating lens 18 at 16a, 18a to direct the new reference beam RB2 at the other inclined face Z of the prism 14. Instead of the laser 16a, a light source may be used which has a distinct spectral line close to the wavelength of the laser 16, filters being used to filter out other wavelengths emitted by the light source. The holographic recording in the recording medium 21 on glass plate 20 is now replayed as a real image onto a light sensitive or photoresist coating on the memory disc 26, using the conjugate reference beam RB2.

It will be appreciated that the process of recording onto the memory disc 26 is straightforward and is applicable to erasable memory discs.

As previously noted, the process of replaying the holographic recording onto the memory disc 26 may be carried out on an apparatus separate but corresponding to the apparatus used for recording the holographic image from the mask onto the recording medium 21 carried on the glass plate 20. If desired, the recording medium may be carried on the prism 14 and the glass plate 20 dispensed with.

The holographic process which has been described enables high precision, high resolution images to be reproduced.

It may be necessary to compensate for variations in the flatness of the optical memory disc 26 when the hologram is being replayed, in order to provide accurate focussing. Therefore the spacers 24 comprise piezoelectric elements the thickness of which can be varied in accordance with an applied electrical voltage. The exposure of the optical memory disc 26 during replay may be carried out in a scanning mode with automatic adjustment of the position of the disc relative to the recording medium, so that each point of the disc at its instant of exposure is at a substantially uniform distance from the medium from which the hologram is being replayed. The scanning process may be continuous, without the need for any stepping, with continuous automatic distance-adjustment or focussing. FIG. 2 shows one arrangement for determining focus. The reference beam RB2 passes through a beam splitter 30 before entering the prism 14. A return beam from the photoresist coating PC is reflected by the beam splitter in the direction A: the portion of reference beam RB2 which is reflected by the beam splitter is reflected by a normal mirror M and returns through the beam splitter in the direction A. If the replayed holographic image is accurately focussed onto the photoresist coating PC on the memory disc, the two beams travelling in the direction A will not interfere. But if the replayed holographic image is not focussed on the photoresist coating PC, the two beams will interfere and produce interference fringes. An interferometer may be provided at this location to detect any interference fringes and provide electrical output signals for controlling the piezoelectric spacer elements described above, so that focussing is performed automatically as scanning proceeds.

In one alternative method, oscillatory signals may be applied to the piezoelectric spacers 24 so as to vibrate or oscillate the optical memory disc over a range of spacings from the recording medium from which the hologram is being replayed onto the disc. In this way each point across the surface of the disc will at some instant of time be at the correct distance from the recording medium for accurate focussing onto it of the holographic image.

In another alternative method, a plurality of holographic images may be formed on the holographic record medium, with the spacers 24 adjusted to alter the distance between the record medium and mask 22 for each successive exposure and a shutter being closed across the light beam OB or RB1 between the successive exposures. In this way the different holographic images carried by the record medium are "stacked" in respective planes. Then during replay onto the optical memory disc, every point across the surface of the disc will have focussed thereon one or another of these "stacked" images.

It may be necessary to overlay two or more different patterns on the disc. For example one pattern may be used in forming a spiral track on the disc, and another pattern used in forming the sites, spaced apart along the spiral track, which are to comprise magneto-optic material on which in use data is recorded. If two or more patterns are to be overlaid on the disc, each pattern must be aligned with the preceding one. In order to achieve this, firstly a global course alignment can be made with reference to the edges of the disc and carried out mechanically. Secondly, a fine alignment can be carried out by the use of a grating structure on the mask which will then become part of the recorded hologram. An equivalent grating structure must be provided on the disc. The interaction of the spatial phase variation of the imaged grating with the grating on the disc will produce a light intensity that is proportional to the relative alignment of the two structures. In order to prevent the exposure of the photosensitive material on the disc (probably photoresist) a different wavelength may be needed for alignment than is used for exposure of the pattern. For example the prism 14 used during replay may be of truncated form, with its apex replaced by a flat surface W parallel to its surface X, as shown by a dotted line in FIG. 1. Then the alignment can be checked by directing a beam B of appropriate wavelength normally through the flat surface W and observing the reflected interference pattern through the surface.

It will be appreciated that the method which has been described may be used to record the required patterns onto an erasable disc or a non-erasable disc. Further, the disc may be used for any form of data including audio or video information or any combination of different forms of data.

I claim:

1. A method of manufacturing an optical memory disc onto which data may be selectively recorded, comprising forming a volume holographic image on a recording medium by interference between an object beam of coherent light after passage through a mask and a first reference beam of coherent light which is totally internally reflected at a surface on which the recording medium is disposed, said image defining pattern of memory sites for the optical disc, then replacing the mask by an optical member disc which has a coating of photosensitive coating using a second reference beam replayed in the opposite direction from the first reference beam, to define said pattern of memory sites on the optical disc, and subsequently depositing, at each of said sites, magneto-optic material onto which data can be selectively recorded.

2. A method as claimed in claim 1, in which the holographic image is recorded on the recording medium in one apparatus and the holographic recording is replayed onto the optical memory disc in a separate, corresponding apparatus.

3. A method as claimed in claim 1, in which the first reference beam is provided by a laser and the second reference beam is provided by a light source having a distinct spectral line close to the wavelength of the first reference beam.

4. A method as claimed in claim 1, in which means are provided for adjusting the distance between the recording medium and the optical memory disc during replay, and replay is carried out in a scanning mode with automatic adjustment of said distance so that each point of the disc at its instant of exposure has the replayed image focussed thereon.

5. A method as claimed in claim 1, in which the distance between the recording medium and the optical memory disc is altered during a single replay exposure, so that each point of the disc will at some instant during exposure have the replayed image focussed thereon.

6. A method as claimed in claim 1, in which a plurality of holographic images are formed on the record medium in a stacked manner by successive exposures with different spacings between the mask and record medium so that during replay each point of the optical memory disc will have focussed thereon one or another of these stacked images.

7. A method as claimed in claim 1, in which an alignment procedure is carried out to align the optical memory disc relative to the image being replayed thereon.

8. A method as claimed in claim 7, in which the image being replayed includes a diffraction grating and a corresponding diffraction grating is also provided on the disc and the alignment procedure comprises aligning the imaged grating with that on the disc.

9. A method of manufacturing an optical memory disc onto which data may be selectively recorded, comprising placing an optical memory disc, which has a coating of photosensitive substance thereon, at a position spaced from a surface on which a recording medium is formed, the recording medium having therein a volume holographic image corresponding to that formed by interference between an object beam of coherent light passed through a mask at the position of the disc and a first reference beam of coherent light totally internally reflected at said surface on which the recording medium is disposed, said image defining a pattern of memory sites for the optical disc, and forming an image of the holographic recording on the photosensitive coating using a second reference beam replayed in a direction corresponding to the opposite direction from the first reference beam to define said pattern of memory sites on the optical disc, and subsequently depositing, at each of said sites, magneto-optic material onto which data can be selectively recorded.

* * * * *